(12) United States Patent
Kotake et al.

(10) Patent No.: US 8,241,528 B2
(45) Date of Patent: Aug. 14, 2012

(54) CONDUCTIVE INK FOR LETTERPRESS REVERSE PRINTING

(75) Inventors: Masayoshi Kotake, Chiba (JP); Yasuhiro Sente, Toda (JP); Hiroshi Isozumi, Tokyo (JP)

(73) Assignee: DIC Corporation, Tokyo (JP)

( * ) Notice: Subject to any disclaimer, the term of this patent is extended or adjusted under 35 U.S.C. 154(b) by 356 days.

(21) Appl. No.: 12/450,153

(22) PCT Filed: Mar. 6, 2008

(86) PCT No.: PCT/JP2008/054051
§ 371 (c)(1),
(2), (4) Date: Feb. 23, 2010

(87) PCT Pub. No.: WO2008/111484
PCT Pub. Date: Sep. 18, 2008

(65) Prior Publication Data
US 2010/0148131 A1 Jun. 17, 2010

(30) Foreign Application Priority Data
Mar. 15, 2007 (JP) .............................. P2007-067277

(51) Int. Cl.
*H01B 1/22* (2006.01)
*H01B 13/00* (2006.01)
*C09D 11/02* (2006.01)
*H05K 3/12* (2006.01)
*H05K 3/20* (2006.01)

(52) U.S. Cl. ..................................... 252/514; 252/520.3

(58) Field of Classification Search .......... 252/512–514, 252/520.3; 427/96.1
See application file for complete search history.

(56) References Cited

U.S. PATENT DOCUMENTS

| 6,341,856 B1* | 1/2002 | Thompson et al. ............ 347/100 |
| 7,101,919 B2* | 9/2006 | Hasegawa et al. ............. 523/160 |
| 2012/0006225 A1* | 1/2012 | Tsukiana et al. ............. 106/31.86 |

FOREIGN PATENT DOCUMENTS

| EP | 1844883 A1 | 10/2007 |
| JP | 3689536 | 3/1999 |
| JP | 2003-151350 A | 5/2003 |
| JP | 2005-057118 A | 3/2005 |
| JP | 2005-126608 A | 5/2005 |
| JP | 2005-128346 A | 5/2005 |
| JP | 2006-240115 A | 9/2006 |
| JP | 2006-278845 A | 10/2006 |
| WO | WO-03/032084 A2 | 4/2003 |

OTHER PUBLICATIONS

International Search Report mailed May 27, 2008, issued on PCT/JP2008/054051.
Supplementary European Search Report dated Feb. 21, 2011, issued for the corresponding European Patent Application No. 08721471.4.

* cited by examiner

*Primary Examiner* — Mark Kopec
(74) *Attorney, Agent, or Firm* — Edwards Wildman Palmer LLP

(57) ABSTRACT

The present invention provides a conductive ink for forming a fine conductive pattern on a substrate by letterpress reverse printing. In particular, the conductive ink enables the pattern to be formed stably without the occurrence of transfer failures and is able to impart superior conductivity by low-temperature baking. The conductive ink, which contains substantially no binder component, comprises as essential components thereof conductive particles having a volume average particle diameter (Mv) of 10 to 700 nm, a release agent, a surface energy regulator and a solvent component, the solvent component being a mixture of a solvent having a surface energy at 25° C. of 27 mN/m or more (high surface energy solvent) and a volatile solvent having a boiling point at atmospheric pressure of 120° C. or lower (low boiling point solvent), and the surface energy of the ink at 25° C. is 10 to 21 mN/m.

2 Claims, No Drawings

CONDUCTIVE INK FOR LETTERPRESS REVERSE PRINTING

TECHNICAL FIELD

The present invention relates to a conductive ink that contains substantially no binder component for forming a conductive pattern by letterpress reverse printing.

BACKGROUND ART

Letterpress reverse printing (see Patent Document 1) has recently been developed as a printing method that differs typical relief printing, intaglio printing, planographic printing and screen printing of the prior art. Patent Document 1 discloses a letterpress reverse printing method comprised of a coating step for forming a coated surface by coating a resin onto a silicone resin surface, a step for transferring and removing a resin onto the convex portion of a letterpress printing plate by pressing the letterpress printing plate formed in a prescribed shape against the coated surface, and a transfer step for transferring resin remaining on the coated surface to a substrate, and according thereto, allows the formation of a color filter free of unevenness in the ink thick film and the obtaining of images having highly defined resist agent patterning and a high degree of resin flatness. The application to patterning of printed boards and patterning of electrical circuits is also described in Patent Document 1 (paragraph 0009) as a precision pattern forming method and an alternative to photolithography technology.

Patent Document 2 discloses a method for producing a printed wiring board by letterpress reverse printing in which viscosity in a step for forming a coated surface by coating functional materials, consisting of a conductor material having volume resistivity of $1\times10^{-4}$ Ω·cm or less, an insulator material having volume resistivity of $1\times10^{10}$ Ω·cm or more and a resistor material having volume resistivity of $1\times10^{-3}$ Ω·cm or more, onto release surfaces of these functional materials is adjusted to 50 mPa·s or less. However, there is no specific disclosure of an ink composition required to realize electrical properties enabling formation of fine patterns by letterpress reverse printing as well as practical use.

For example, in order to stably form conductive patterns having a line width of 10 μm or less and thickness of 1 μm by letterpress reverse printing without the occurrence of transfer failures as well as realize functions such as conductivity and insulation required by each of the patterns formed, a specific ink formulation is required for each ink forming the conductor, insulator and resistor. In particular, a conductive ink composition for letterpress reverse printing that allows the formation highly conductive patterns by low-temperature heat treatment at 200° C. or lower requires a specific composition in consideration of electrical properties as well as printability.

Patent Document 3 discloses a precision patterning ink composition that has viscosity and surface energy such that the ink composition is able to form a uniform ink coated film on a blanket when forming a fine, precise printing pattern by letterpress reverse printing, realizes drying properties, adhesiveness and cohesiveness such that a finished printing pattern can be formed on the blanket by the time a printing pattern is formed by contact with the letterpress plate, and is provided with adhesiveness and cohesiveness that enables the ink coated film on the blanket to be transferred completely to a printed substrate, wherein the viscosity of the ink is 5 mPa·s or less, the surface energy is 25 mN/m or less, the composition contains a volatile solvent and a solid that is incompatible with a resin that is soluble in this volatile solvent, and the volatile solvent is a mixture of a rapid-drying solvent and a slow-drying solvent. Although Patent Document 3 provides a detailed disclosure of an ink composition required for forming a precision pattern by letterpress reverse printing, there is no disclosure of, for example, a composition required for imparting superior electrical conductivity to a pattern formed with ink for forming a conductive pattern.

Patent Document 1: Japanese Patent No. 3689536
Patent Document 2: Japanese Unexamined Patent Application, First Publication No. 2005-57118
Patent Document 3: Japanese Unexamined Patent Application, First Publication No. 2005-126608

DISCLOSURE OF THE INVENTION

Problems to be solved by the Invention

An object of the present invention is to provide a conductive ink for letterpress reverse printing when forming a fine, conductive pattern on a substrate by letterpress reverse printing that enables the pattern to be formed stably without the occurrence of transfer failures and is able to impart superior conductivity by low-temperature baking.

Means for Solving the Problems

In order to solve the aforementioned problems, the present invention provides a conductive ink for forming a conductive pattern by letterpress reverse printing that contains substantially no binder component, comprising as essential components thereof conductive particles having a volume average particle diameter (Mv) of 10 to 700 nm, a release agent, a surface energy regulator and a solvent component, wherein the solvent component is a mixture of a solvent having a surface energy at 25° C. of 27 mN/m or more and a volatile solvent having a boiling point at atmospheric pressure of 120° C. or lower, and the surface energy of the ink at 25° C. is 10 to 21 mN/m.

Effects of the Invention

According to the conductive ink for letterpress reverse printing of the present invention, a fine conductor pattern can be stably formed by letterpress reverse printing without the occurrence of transfer failures, and since the formed fine pattern can be baked at a low temperature of 200° C. or lower in the case of using silver for the conductive particles, for example, superior conductivity of a specific resistance on the order of $10^{-5}$ Ω·cm or less can be imparted. In addition, since the conductive ink also has superior transferability, the fine pattern can be formed throughout entire transfer.

BEST MODE FOR CARRYING OUT THE INVENTION

The following provides an explanation of the invention based on the best mode thereof.

The ink of the present invention relates to a conductive ink for forming a conductive pattern by letterpress reverse printing.

In the present invention, letterpress reverse printing refers to a printing method in which an ink coated surface is formed by coating ink onto a blanket, and pressing a letterpress printing plate against the coated surface to remove a portion of the ink that contacts the letterpress printing plate followed by transferring the ink remaining on the blanket to a printed material.

The conductive ink of the present invention contains substantially no binder component. In the case of ordinary inks, although solid particles such as a pigment are mixed and dispersed into a binder component, the present invention is required to substantially not contain a binder component in order to make the ratio of conductive particles adequately high after the ink dries. A binder component as referred to in the present invention is a resin component, specific examples of which include natural rubber, polyolefins, polyethers, polyesters, acrylic resin, phenol resin, melamine resin, benzoguanamine resin, epoxy resin and urethane resin, and the conductive ink of the present invention contains substantially none of these resins.

However, since there is the possibility that the essential components used or optionally added additives may contain a resin component as a portion of the raw materials thereof, the amount of resin component based on the total weight of the ink is preferably 2% or less, more preferably 1% or less and even more preferably 0.5% or less.

The conductive ink of the present invention contains as essential components thereof conductive particles having a volume average particle diameter (Mv=Mean Volume Diameter) of 10 to 700 nm, a release agent, a surface energy regulator and a solvent component. Since a binder component is substantially not contained in the present invention, in the case of adding other arbitrary components, the components are selected from among low molecular weight components.

Examples of conductive particles include metal particles such as gold (Au), silver (Ag), copper (Cu), nickel (Ni), zinc (Zn), aluminum (Al), iron (Fe), platinum (Pt), palladium (Pd), tin (Sn), chromium (Cr) or lead (Pb) as well as alloys of these metals such as palladium alloys (Ag/Pd); heat-decomposable metal compound silver particles that yield a conductive metal by heat decomposition following baking of silver oxide ($Ag_2O$) and the like at 200° C. or lower; conductive metal oxide particles such as zinc oxide (ZnO), indium tin oxide (ITO) or indium zinc oxide (IZO); and conductive polymer particles such as polyethylenedioxythiophene/polystyrene sulfonate (PEDOT/PSS). The volume average particle diameter of these conductive particles is preferably 10 to 700 nm, more preferably 10 to 400 nm and even more preferably 10 to 100 nm. The use of particles having these nano-order volume average particle diameters makes it possible to enhance adherence due to increased cohesiveness, while also enabling the formation of fine patterns.

Among these particles, silver and/or silver oxide particles, namely silver particles, silver oxide particles, particles that compound silver and silver oxide, or mixtures of two or more types thereof are preferable since they allow the obtaining of satisfactory electrical conductivity.

Preferable examples of the release agent include silicone oils such as members of the KF96 series (trade name) manufactured by Shin-Etsu Chemical Co., Ltd. or members of the SH28 series (trade name) manufactured by Dow Corning Toray Co., Ltd. In particular, a dimer to 30 mer of silicone in the form of a low molecular silicone (about 148 to 2220 in terms of molecular weight) is preferable since it has little effect on ink patterning and conductivity of the coated film after baking. Examples of such silicone oils include silicone oils having a dynamic viscosity of 20 $mm^2/s$ or less at 25° C. that are members of the KF96 series manufactured by Shin-Etsu Chemical Co., Ltd. The content of this release agent is 0.05 to 5.0% by weight and preferably 0.1 to 1.0% by weight based on the total ink composition. The addition of this release agent ensures releasability from the blanket even if wettability of the ink to the blanket is increased with a solvent or by adjusting surface energy. As a result, transferability during letterpress reverse printing can be improved.

A silicone-based or fluorine-based agent can be preferably used for the surface energy regulator. Fluorine-based surface energy regulators are particularly preferable since they demonstrate considerable effects even when added in small amounts. Members of the Megaface series (trade name) manufactured by Dainippon Ink and Chemicals, Inc., for example, are preferably used as fluorine-based surface energy regulators. The content of the surface energy regulator is 0.05 to 5.0% by weight and preferably 0.1 to 1.5% by weight based on the total ink composition.

The conductive ink of the present invention allows the obtaining of a more uniform coating as a result of improving the smoothness of the ink coated film when coating the ink onto the blanket by adding the surface energy regulator as described above to adjust the surface energy at 25° C. of the conductive ink composition in the range of 10 to 21 mN/m. However, if the amount added is less than this range, the ink is repelled from the blanket or the ink coated film is no longer uniform and becomes uneven, thereby making this undesirable, while if the amount added is too great, a decrease occurs in the conductivity of the ink coated film after baking, thereby making this undesirable as well.

The solvent component is a mixture of a solvent having a surface energy at 25° C. of 27 mN/m or more (to also be referred to as "high surface energy solvent") and a volatile solvent having a boiling point at atmospheric pressure of 120° C. or lower (to also be referred to as "low boiling point solvent").

Examples of high surface energy solvents that satisfy the above conditions include water, PD9 (trade name of diols manufactured by Kyowa Chemical Industry Co., Ltd., surface energy: approx. 32 mN/m), propylene carbonate (PC, surface energy: approx. 36 mN/m), ethylene glycol (EG, surface energy: approx. 40 mN/m), and propylene glycol monomethyl ether acetate (PGMAC, surface energy: approx. 27 mN/m). The high surface energy solvent preferably has a surface energy of 30 mN/m or more in addition to satisfying the above conditions.

The content of the high surface energy solvent is preferably 1 to 500%, more preferably 1 to 200% and even more preferably 3 to 70% based on the weight of the conductive particles (or only the solid fraction in the case of a raw material dispersed in a solvent).

In addition, a solvent that is selected in consideration of volatility and the like is used as a low boiling point solvent that satisfies the above conditions, examples of which are indicated below. Examples of ester-based solvents include ethyl acetate, n-propyl acetate and isopropyl acetate, examples of alcohol-based solvents include methanol, ethanol, 1-propanol and 2-propanol, and examples of hydrocarbon-based solvents include toluene, pentane, hexane and cyclohexane. In addition, these also may be mixtures of the same type of solvent or mixtures of a plurality of types.

The conductive ink of the present invention can be easily produced by mixing the aforementioned raw materials to uniformity. Printing of a conductive pattern onto a printed material using this conductive ink is carried out by letterpress reverse printing. There are no particular limitations on the printed material, examples of which include plastic, paper, glass, ceramics and metal.

During letterpress reverse printing, ink is first coated onto a blanket to form an ink coated surface. A silicone blanket composed of silicone is preferable for the blanket. After having formed an ink coated surface on the surface of the blanket, the viscosity of the ink increases after allowing to stand for a prescribed amount of time as a result of the low boiling point solvent volatilizing and being absorbed into the blanket. At this time, the high surface energy solvent remains in the ink, thereby maintaining suitable ink cohesion.

When a letterpress printing plate, in which a printing block is formed corresponding to a prescribed pattern, is pressed against the ink coated surface, ink of the portion that contacts the letterpress printing plate is removed from the blanket. At this time, as a result of the conductive ink having suitable cohesion, separation of ink from the blanket without damaging the structure thereof and adhesion of ink to the letterpress printing plate are carried out reliably, thereby inhibiting undesirable retention of ink on the blanket. As a result, an ink pattern corresponding to the pattern of the letterpress printing plate is formed on the blanket by the ink remaining on the blanket.

The wet or semi-dry conductive ink remaining on the blanket is transferred to a printed material. At this time, as a result of the conductive ink having suitable cohesion, separation of ink from the blanket and adhesion to the printed material are carried out reliably, thereby inhibiting undesirable retention of ink on the blanket. As a result, a conductive pattern is formed on a printed material according to a pattern that is the reverse of the pattern formed on the letterpress printing plate.

In the case of conventional inks, although conductivity of the conductive pattern decreases when a binder component is added, if the ink is prepared without adding a binder component, the cohesion of the ink decreases resulting in the formation of portions where ink appears to have not been transferred to the letterpress printing plate or printed material unlike the intention (transfer residual), thereby making it difficult to form highly defined, fine patterns. In contrast, according to the conductive ink of the present invention, as a result of having an ink composition as described above, transfer residual is inhibited, thereby realizing complete transfer and facilitating the formation of highly defined, fine patterns. In addition, adhesion of the ink is obtained in a short period of time due to volatilization of the low boiling point solvent, while on the other hand, retention of the high surface energy solvent maintains the cohesion of the ink, thereby preserving the pattern.

A conductive pattern printed onto a printed material can be used to form a conductive layer by drying as necessary followed by baking at a low temperature of 200° C. or lower. At this time, all or a large portion of the high surface energy solvent evaporates. A conductive layer formed in this manner can be used in organic semiconductor electrodes, wiring, flexible board wiring, electromagnetic wave shielding, transparent electrodes (touch panels) and the like. For example, the present invention can be used to form a conductive pattern having a thickness of 1 μm or less (submicron order) to several μm and a width of several μm to several tens of μm for use in an electrode or wiring of a thin film transistor (TFT).

EXAMPLES

The following provides a detailed explanation of the present invention through examples thereof. In addition, the symbol "%" is based on weight unless specifically stated otherwise.

The materials indicated below were used as raw materials of the conductive inks indicated in the examples and comparative examples.

(Conductive Particles)
Fine Sphere SVE102: silver nanodispersion manufactured by Nippon Paint Co., Ltd. (particle diameter: approx. 20 nm, solid fraction: approx. 30%, ethanol dispersion, contains 2% or less of dispersant)

AN30: Silver nanoslurry manufactured by Mitsui Mining and Smelting Co., Ltd. (particle diameter: approx. 60 nm, solid fraction: approx. 70%, slurry in propylene glycol monomethyl ether (PGM))

Silver oxide-coated FHD: Manufactured by Mitsui Mining and Smelting Co., Ltd. (particle diameter: approx. 0.4 μm, silver oxide-coated silver fine particles, slurry having a solid fraction of approx. 70% in water)

(Surface Energy Regulators)
TF-1303: Fluorine-based surface energy regulator manufactured by Dainippon Ink and Chemicals, Inc. (solid fraction: approx. 30%)
F-444: Fluorine-based surface energy regulator manufactured by Dainippon Ink and Chemicals, Inc.

(Solvents)
PC: Propylene carbonate
EG: Ethylene glycol
PD9: Diol manufactured by Kyowa Chemical Industry Co., Ltd.
PGMAC: Propylene glycol monomethyl ether acetate
PGM: Propylene glycol monomethyl ether
IPA: Isopropyl alcohol
IPAC: Isopropyl acetate (Silicone Oils)
KF96-1cs: Silicone oil manufactured by Shin-Etsu Chemical Co., Ltd.
SH28: Silicone oil manufactured by Dow Corning Toray Co., Ltd.

(Binder Component)
WEZ-888: Acrylic resin manufactured by Dainippon Ink and Chemicals, Inc. (trade name: Acrydic WEZ-888, solid fraction: 55%, in 1-butanol)

Example 1

A conductive ink according to Example 1 was produced by blending 48% conductive particles in the form of the aforementioned Fine Sphere SVE102 (solid fraction: approx. 30%), 1.3% fluorine-based surface energy regulator in the form of the aforementioned TF-1303 (solid fraction: approx. 30%), 50% low boiling point solvent in the form of ethanol, 0.5% high surface energy solvent in the form of PC, and 0.2% by weight of release agent in the form of the aforementioned KF96-1cs. Measurement of the surface energy of this conductive ink yielded a value of 14.7 mN/m. A conductive pattern having a line width of about 10 μm was produced according to the following procedure by letterpress reverse printing using a glass letterpress printing plate. First, the ink was uniformly coated onto a silicone blanket with a bar coater, followed by pressing the glass letterpress printing plate against the ink coated surface on the blanket to transfer and remove the ink (initial transfer). Moreover, glass was pressed against the ink pattern formed on the blanket to transfer the ink pattern to the glass (final transfer). There was no ink remaining on the blanket during both initial transfer and final transfer, and favorable transferability was demonstrated. In addition, the transferred pattern image having a line width of about 10 μm was free of distortion and omissions, and sharp edges were formed. After forming an ink thin film on a slide glass with a spin coater and baking at 180° C., measurement of specific resistance yielded a value of $4.2 \times 10^{-6}$ Ω·cm.

Example 2

A conductive ink according to Example 2 was produced by blending 48% conductive particles in the form of the aforementioned Fine Sphere SVE102 (solid fraction: approx. 30%), 1.7% fluorine-based surface energy regulator in the form of the aforementioned TF-1303 (solid fraction: approx. 30%), 40% low boiling point solvent in the form of IPAC, 10% high surface energy solvent in the form of PGMAC, and 0.3% by weight of release agent in the form of the aforementioned SH28. Measurement of the surface energy of this conductive ink yielded a value of 14.3 mN/m. Transferability during production of a conductive pattern by letterpress reverse printing was favorable since there was no ink remaining on the blanket during both initial transfer and final transfer. The transferred pattern image having a line width of about 10 μm was free of distortion and omissions, and sharp edges were formed. After forming an ink thin film on a slide glass with a spin coater and baking at 180° C., measurement of specific resistance yielded a value of $8\times10^{-6}$ Ω·cm.

Example 3

A conductive ink according to Example 3 was produced by blending conductive particles in the form of 12% of the aforementioned Mitsui Mining and Smelting silver nanoslurry (solid fraction: approx. 70%) and 8% of silver oxide-coated FHD (solid fraction: approx. 70%), fluorine-based surface energy regulator in the form of 1.5% of the aforementioned TF-1303 (solid fraction: approx. 30%) and 0.2% F-444, low boiling point solvent in the form of 7.5% ethanol and 70% IPAC, high surface energy solvent in the form of 0.5% of the aforementioned PD9, and 0.3% by weight of release agent in the form of the aforementioned SH28. Measurement of the surface energy of this conductive ink yielded a value of 18.7 mN/m. Transferability during production of a conductive pattern by letterpress reverse printing was favorable since there was no ink remaining on the blanket during both initial transfer and final transfer. The transferred pattern image having a line width of about 10 μm was free of distortion and omissions, and sharp edges were formed. After forming an ink thin film on a slide glass with a spin coater and baking at 180° C., measurement of specific resistance yielded a value of $2.0\times10^{-5}$ Ω·cm.

Comparative Example 1

A conductive ink according to Comparative Example 1 was produced by blending 48% conductive particles in the form of the aforementioned Fine Sphere SVE102 (solid fraction: approx. 30%), 1.4% fluorine-based surface energy regulator in the form of the aforementioned TF-1303, 40% low boiling point solvent in the form of IPAC, and high surface energy solvent in the form of 0.6% EG and 10% PGMAC. Measurement of the surface energy of this conductive ink yielded a value of 15.3 mN/m. Transferability during production of a conductive pattern by letterpress reverse printing was such that ink remained on the blanket during both initial transfer and final transfer, and numerous omissions were observed in the pattern. In addition, after forming an ink thin film on a slide glass with a spin coater and baking at 180° C., measurement of specific resistance yielded a value of $4.5\times10^{-6}$ Ω·cm.

Comparative Example 2

A conductive ink according to Comparative Example 2 was produced by blending 48% conductive particles in the form of the aforementioned Fine Sphere SVE102 (solid fraction: approx. 30%), 1.5% fluorine-based surface energy regulator in the form of the aforementioned TF-1303 (solid content: approx. 30%), 36% low boiling point solvent in the form of IPA, high surface energy solvent in the form of 0.5% PC and 10% PGMAC, and 4% binder component in the form of the aforementioned WEZ-888 (solid fraction: 55%). Measurement of the surface energy of this conductive ink yielded a value of 15.7 mN/m. Transferability during production of a conductive pattern by letterpress reverse printing was such that a slight amount of ink remained on the blanket during both initial transfer and final transfer, and omissions were observed in the pattern. After forming an ink thin film on a slide glass with a spin coater and baking at 180° C., measurement of specific resistance yielded a value of $1.2\times10^{-2}$ Ω·cm.

Comparative Example 3

A conductive ink according to Comparative Example 3 was produced by blending 50% conductive particles in the form of the aforementioned Fine Sphere SVE102 (solid fraction: approx. 30%), 1.5% fluorine-based surface energy regulator in the form of the aforementioned TF-1303 (solid content: approx. 30%) and 48.5% low boiling point solvent in the form of ethanol. Measurement of the surface energy of this conductive ink yielded a value of 14.9 mN/m. Transferability during production of a conductive pattern by letterpress reverse printing was such that the drying time of an ink thin film on a blanket formed with a bar coater was extremely fast and the thin film strongly adhered to the blanket, making it difficult for the ink to transfer to a glass letterpress printing plate.

The above results are summarized in Table 1.

TABLE 1

|  |  | Ex. 1 | Ex. 2 | Ex. 3 | Comp. Ex. 1 | Comp. Ex. 2 | Comp. Ex. 3 |
|---|---|---|---|---|---|---|---|
| Conductive particles | SVE102 | 48 | 48 |  | 48 | 48 | 50 |
|  | AN30 |  |  | 12 |  |  |  |
|  | Silver oxide-coated FHD |  |  | 8 |  |  |  |
| Surface energy regulator | TF-1303 | 1.3 | 1.7 | 1.5 | 1.4 | 1.5 | 1.5 |
|  | F-444 |  |  | 0.2 |  |  |  |
| Low boiling point solvent | Ethanol | 50 |  | 7.5 |  |  | 48.5 |
|  | IPA |  |  |  |  | 36 |  |
|  | IPAC |  | 40 | 70 | 40 |  |  |
| High surface energy | PC | 0.5 |  |  |  | 0.5 |  |
|  | EG |  |  |  | 0.6 |  |  |
|  | PD9 |  |  | 0.5 |  |  |  |

TABLE 1-continued

| | | Ex. 1 | Ex. 2 | Ex. 3 | Comp. Ex. 1 | Comp. Ex. 2 | Comp. Ex. 3 |
|---|---|---|---|---|---|---|---|
| solvent | PGMAC | | 10 | | 10 | 10 | |
| Release agent | KF96-1cs | 0.2 | | | | | |
| | SH28 | | 0.3 | 0.3 | | | |
| Binder component | WEZ-888 | | | | | 4 | |
| Surface energy (mN/m) | | 14.7 | 14.3 | 18.7 | 15.3 | 15.7 | 14.9 |
| Initial transferability | | ○ | ○ | ○ | Δ | Δ | X |
| Final transferability | | ○ | ○ | ○ | Δ | Δ | — |
| Pattern image quality | | ○ | ○ | ○ | X | X | — |
| Specific resistance after baking at 180° C. (Ω · cm) | | $4.2 \times 10^{-6}$ | $8 \times 10^{-6}$ | $2.0 \times 10^{-5}$ | $4.5 \times 10^{-6}$ | $1.2 \times 10^{-2}$ | — |

As shown in Table 1, according to the conductive inks of Examples 1 to 3, transferability and specific resistance following low-temperature baking were favorable.

INDUSTRIAL APPLICABILITY

The conductive ink of the present invention is optimal for forming a highly defined, fine printing pattern on a printed substrate by letterpress reverse printing, and can be used in the production of, for example, organic semiconductor electrodes, wiring, flexible board wiring, electromagnetic wave shielding and transparent electrodes (touch panels).

The invention claimed is:

1. A conductive ink for forming a conductive pattern by letterpress reverse printing using a silicone blanket comprising as essential components thereof:
    conductive particles having a volume average particle diameter (Mv) of 10 to 700 nm, a release agent, a surface energy regulator and a solvent component, wherein
    the release agent is a silicone oil,
    the solvent component is a mixture of a solvent having a surface energy at 25° C. of 27 mN/m or more and a volatile solvent having a boiling point at atmospheric pressure of 120° C. or lower,
    the surface energy of the ink at 25° C. is 10 to 21 mN/m, and the amount of resin component based on the total weight of the ink is 2% or less.

2. The conductive ink according to claim 1, wherein the conductive particles are silver and/or silver oxide.

* * * * *